(12) United States Patent
Chow et al.

(10) Patent No.: US 8,704,349 B2
(45) Date of Patent: Apr. 22, 2014

(54) INTEGRATED CIRCUIT PACKAGE SYSTEM WITH EXPOSED INTERCONNECTS

(75) Inventors: Seng Guan Chow, Singapore (SG); Il Kwon Shim, Singapore (SG); Byung Joon Han, Singapore (SG)

(73) Assignee: Stats Chippac Ltd., Singapore (SG)

( * ) Notice: Subject to any disclaimer, the term of this patent is extended or adjusted under 35 U.S.C. 154(b) by 187 days.

(21) Appl. No.: 11/354,806

(22) Filed: Feb. 14, 2006

(65) Prior Publication Data

US 2007/0190690 A1 Aug. 16, 2007

(51) Int. Cl.
H01L 23/02 (2006.01)
H01L 21/44 (2006.01)

(52) U.S. Cl.
USPC ............ 257/686; 257/723; 438/107; 438/109

(58) Field of Classification Search
USPC .......... 438/107–110; 257/686, 723, 724, 777, 257/778, 780, E25.006, E25.011, E25.013, 257/E25.027, 25.006
See application file for complete search history.

(56) References Cited

U.S. PATENT DOCUMENTS

| | | |
|---|---|---|
| 4,524,121 A | 6/1985 | Gleim et al. |
| 4,697,203 A | 9/1987 | Sakai et al. |
| 4,764,804 A | 8/1988 | Sahara et al. |
| 4,894,707 A | 1/1990 | Yamawaki et al. |
| 5,186,383 A | 2/1993 | Melton et al. |
| 5,214,307 A | 5/1993 | Davis |
| 5,214,308 A | 5/1993 | Nishiguchi et al. |
| 5,222,014 A | 6/1993 | Lin |
| 5,229,960 A | 7/1993 | De Givry |
| 5,269,453 A | 12/1993 | Melton et al. |
| 5,340,771 A | 8/1994 | Rostoker |
| 5,373,189 A | 12/1994 | Massit et al. |
| 5,436,203 A | 7/1995 | Lin |
| 5,444,296 A | 8/1995 | Kaul et al. |
| 5,495,398 A | 2/1996 | Takiar et al. |
| 5,550,711 A | 8/1996 | Burns et al. |
| 5,579,207 A | 11/1996 | Hayden et al. |
| 5,607,227 A | 3/1997 | Yasumoto et al. |
| 5,650,667 A | 7/1997 | Liou |
| 5,652,185 A | 7/1997 | Lee |
| 5,734,199 A | 3/1998 | Kawakita et al. |
| 5,744,863 A | 4/1998 | Culnane et al. |
| 5,748,452 A | 5/1998 | Londa |
| 5,760,478 A | 6/1998 | Bozso et al. |

(Continued)

FOREIGN PATENT DOCUMENTS

| | | |
|---|---|---|
| JP | 2000-228468 | 8/2000 |
| JP | 2003-086733 | 3/2003 |

OTHER PUBLICATIONS

Kim, J. and Boruch, J., "Enabling a Microelectronic WorldTM", Amkor Technology, Inc.2002 Annual Report, retrieved from Internet:<URL:http://media.corporate-ir.net/media_files/iro/11/115640/2002AnnualReport.pdf.

*Primary Examiner* — Hung Vu
(74) *Attorney, Agent, or Firm* — Ishimaru & Associates LLP

(57) ABSTRACT

An integrated circuit package system is provided including providing a substrate having a first surface and second surface; mounting interconnects to the first surface; mounting integrated circuit dies to the first surface; embedding the interconnects and the integrated circuit die within an encapsulant on the substrate and leaving top portions of the interconnects exposed; attaching solder balls to the second surface; and singulating the substrate and the encapsulant into a plurality of integrated circuit packages.

8 Claims, 10 Drawing Sheets

(56) References Cited

U.S. PATENT DOCUMENTS

| | | | |
|---|---|---|---|
| 5,811,351 A | 9/1998 | Kawakita et al. |
| 5,824,569 A | 10/1998 | Brooks et al. |
| 5,828,128 A | 10/1998 | Higashiguchi et al. |
| 5,844,315 A | 12/1998 | Melton et al. |
| 5,854,507 A | 12/1998 | Miremadi et al. |
| 5,898,219 A | 4/1999 | Barrow |
| 5,899,705 A | 5/1999 | Akram |
| 5,903,049 A | 5/1999 | Mori |
| 5,963,430 A | 10/1999 | Londa |
| 5,973,337 A | 10/1999 | Knapp et al. |
| 5,977,640 A | 11/1999 | Bertin et al. |
| 5,977,641 A | 11/1999 | Takahashi et al. |
| 5,982,633 A | 11/1999 | Jeansonne |
| 5,994,166 A | 11/1999 | Akram et al. |
| 6,025,648 A | 2/2000 | Takahashi et al. |
| RE36,613 E | 3/2000 | Ball |
| 6,034,875 A | 3/2000 | Heim et al. |
| 6,075,289 A | 6/2000 | Distefano |
| 6,083,775 A | 7/2000 | Huang et al. |
| 6,083,811 A | 7/2000 | Riding et al. |
| 6,101,100 A | 8/2000 | Londa |
| 6,107,164 A | 8/2000 | Ohuchi |
| 6,118,176 A | 9/2000 | Tao et al. |
| 6,121,682 A | 9/2000 | Kim |
| 6,130,448 A | 10/2000 | Bauer et al. |
| 6,133,626 A | 10/2000 | Hawke et al. |
| 6,143,588 A | 11/2000 | Glenn |
| 6,144,507 A | 11/2000 | Hashimoto |
| 6,157,080 A | 12/2000 | Tamaki et al. |
| 6,165,815 A | 12/2000 | Ball |
| 6,201,266 B1 | 3/2001 | Ohuchi et al. |
| 6,201,302 B1 | 3/2001 | Tzu |
| 6,204,562 B1 | 3/2001 | Ho et al. |
| 6,225,699 B1 | 5/2001 | Ference et al. |
| 6,238,949 B1 | 5/2001 | Nguyen et al. |
| 6,242,932 B1 | 6/2001 | Hembree |
| 6,246,123 B1 | 6/2001 | Landers, Jr. et al. |
| 6,265,766 B1 | 7/2001 | Moden |
| 6,266,197 B1 | 7/2001 | Glenn et al. |
| 6,274,930 B1 | 8/2001 | Vaiyapuri et al. |
| 6,291,263 B1 | 9/2001 | Huang |
| 6,291,884 B1 | 9/2001 | Glenn et al. |
| 6,294,406 B1 | 9/2001 | Bertin et al. |
| 6,297,131 B1 | 10/2001 | Yamada et al. |
| 6,316,735 B1 | 11/2001 | Higashiguchi |
| 6,316,838 B1 | 11/2001 | Ozawa et al. |
| 6,333,552 B1 | 12/2001 | Kakimoto et al. |
| 6,340,846 B1 | 1/2002 | LoBianco et al. |
| 6,353,257 B1 | 3/2002 | Huang |
| 6,358,773 B1 | 3/2002 | Lin et al. |
| 6,369,454 B1 | 4/2002 | Chung |
| 6,372,551 B1 | 4/2002 | Huang |
| 6,376,904 B1 | 4/2002 | Haba et al. |
| 6,379,988 B1 | 4/2002 | Peterson et al. |
| 6,384,472 B1 | 5/2002 | Huang |
| 6,388,313 B1 | 5/2002 | Lee et al. |
| 6,396,116 B1 | 5/2002 | Kelly et al. |
| 6,400,007 B1 | 6/2002 | Wu et al. |
| 6,407,381 B1 | 6/2002 | Glenn et al. |
| 6,407,456 B1 | 6/2002 | Ball |
| 6,410,861 B1 | 6/2002 | Huang et al. |
| 6,413,798 B2 | 7/2002 | Asada |
| 6,414,381 B1 | 7/2002 | Takeda |
| 6,420,204 B2 | 7/2002 | Glenn |
| 6,420,244 B2 | 7/2002 | Lee |
| 6,424,050 B1 | 7/2002 | Komiyama |
| 6,441,496 B1 | 8/2002 | Chen et al. |
| 6,445,064 B1 | 9/2002 | Ishii et al. |
| 6,455,353 B2 | 9/2002 | Lin |
| 6,462,421 B1 | 10/2002 | Hsu et al. |
| 6,472,732 B1 | 10/2002 | Terui |
| 6,489,676 B2 | 12/2002 | Taniguchi et al. |
| 6,492,726 B1 | 12/2002 | Quek et al. |
| 6,501,165 B1 | 12/2002 | Farnworth et al. |
| 6,503,780 B1 | 1/2003 | Glenn et al. |
| 6,509,639 B1 | 1/2003 | Lin |
| 6,512,219 B1 | 1/2003 | Webster et al. |
| 6,512,303 B2 | 1/2003 | Moden |
| 6,529,027 B1 | 3/2003 | Akram et al. |
| 6,534,419 B1 | 3/2003 | Ong |
| 6,538,319 B2 | 3/2003 | Terui |
| 6,541,857 B2 | 4/2003 | Caletka et al. |
| 6,545,365 B2 | 4/2003 | Kondo et al. |
| 6,545,366 B2 | 4/2003 | Michii et al. |
| 6,552,423 B2 | 4/2003 | Song et al. |
| 6,555,902 B2 | 4/2003 | Lo et al. |
| 6,555,917 B1 | 4/2003 | Heo |
| 6,566,745 B1 | 5/2003 | Beyne et al. |
| 6,570,249 B1 | 5/2003 | Liao et al. |
| 6,571,466 B1 | 6/2003 | Glenn et al. |
| 6,580,169 B2 | 6/2003 | Sakuyama et al. |
| 6,583,503 B2 | 6/2003 | Akram et al. |
| 6,590,281 B2 | 7/2003 | Wu et al. |
| 6,593,647 B2 | 7/2003 | Ichikawa |
| 6,593,648 B2 | 7/2003 | Emoto |
| 6,593,662 B1 | 7/2003 | Pu et al. |
| 6,599,779 B2 | 7/2003 | Shim et al. |
| 6,607,937 B1 | 8/2003 | Corisis |
| 6,610,563 B1 | 8/2003 | Waitl et al. |
| 6,611,063 B1 | 8/2003 | Ichinose et al. |
| 6,613,980 B1 | 9/2003 | McGhee et al. |
| 6,617,198 B2 | 9/2003 | Brooks |
| 6,621,169 B2 | 9/2003 | Kikuma et al. |
| 6,621,172 B2 | 9/2003 | Nakayama et al. |
| 6,627,864 B1 | 9/2003 | Glenn et al. |
| 6,627,979 B2 | 9/2003 | Park |
| 6,642,609 B1 | 11/2003 | Minamio et al. |
| 6,649,445 B1 | 11/2003 | Qi et al. |
| 6,649,448 B2 | 11/2003 | Tomihara |
| 6,650,019 B2 | 11/2003 | Glenn et al. |
| 6,667,556 B2 | 12/2003 | Moden |
| 6,674,156 B1 | 1/2004 | Bayan et al. |
| 6,690,089 B2 | 2/2004 | Uchida |
| 6,692,993 B2 | 2/2004 | Li et al. |
| 6,693,364 B2 | 2/2004 | Tao et al. |
| 6,700,178 B2 | 3/2004 | Chen et al. |
| 6,700,192 B2 | 3/2004 | Matsuzawa et al. |
| 6,706,557 B2 | 3/2004 | Koopmans |
| 6,707,140 B1 | 3/2004 | Nguyen et al. |
| 6,713,366 B2 | 3/2004 | Mong et al. |
| 6,716,670 B1 | 4/2004 | Chiang |
| 6,734,539 B2 | 5/2004 | Degani et al. |
| 6,734,552 B2 | 5/2004 | Combs et al. |
| 6,734,569 B2 | 5/2004 | Appelt et al. |
| 6,737,750 B1 | 5/2004 | Hoffman et al. |
| 6,740,980 B2 | 5/2004 | Hirose |
| 6,746,894 B2 | 6/2004 | Fee et al. |
| 6,747,361 B2 | 6/2004 | Ichinose |
| 6,762,488 B2 | 7/2004 | Maeda et al. |
| 6,774,475 B2 | 8/2004 | Blackshear et al. |
| 6,777,799 B2 | 8/2004 | Kikuma et al. |
| 6,777,819 B2 | 8/2004 | Huang |
| 6,784,534 B1 | 8/2004 | Glenn et al. |
| 6,787,915 B2 | 9/2004 | Uchida et al. |
| 6,787,916 B2 | 9/2004 | Halahan |
| 6,791,036 B1 | 9/2004 | Chen et al. |
| 6,791,076 B2 | 9/2004 | Webster |
| 6,794,741 B1 | 9/2004 | Lin et al. |
| 6,794,749 B2 | 9/2004 | Akram |
| 6,809,405 B2 | 10/2004 | Ito et al. |
| 6,815,254 B2 | 11/2004 | Mistry et al. |
| 6,818,980 B1 | 11/2004 | Pedron, Jr. |
| 6,828,665 B2 | 12/2004 | Pu et al. |
| 6,833,612 B2 | 12/2004 | Kinsman |
| 6,835,598 B2 | 12/2004 | Baek et al. |
| 6,838,761 B2 | 1/2005 | Karnezos |
| 6,847,105 B2 | 1/2005 | Koopmans |
| 6,847,109 B2 | 1/2005 | Shim |
| 6,851,598 B2 | 2/2005 | Gebauer et al. |
| 6,852,570 B2 | 2/2005 | Hasegawa |
| 6,861,288 B2 | 3/2005 | Shim et al. |
| 6,861,683 B2 | 3/2005 | Rissing et al. |
| 6,864,566 B2 | 3/2005 | Choi |
| 6,873,034 B2 | 3/2005 | Nakamura et al. |

(56) References Cited

U.S. PATENT DOCUMENTS

| | | |
|---|---|---|
| 6,881,611 B1 | 4/2005 | Fukasawa et al. |
| 6,882,057 B2 | 4/2005 | Hsu |
| 6,890,798 B2 | 5/2005 | McMahon |
| 6,891,239 B2 | 5/2005 | Anderson et al. |
| 6,900,079 B2 | 5/2005 | Kinsman et al. |
| 6,900,528 B2 | 5/2005 | Mess et al. |
| 6,900,549 B2 | 5/2005 | Brooks |
| 6,906,415 B2 | 6/2005 | Jiang et al. |
| 6,906,416 B2 | 6/2005 | Karnezos |
| 6,916,683 B2 | 7/2005 | Stephenson et al. |
| 6,930,378 B1 | 8/2005 | St. Amand et al. |
| 6,930,396 B2 | 8/2005 | Kurita et al. |
| 6,933,176 B1 | 8/2005 | Kirloskar et al. |
| 6,933,598 B2 | 8/2005 | Karnezos |
| 6,951,982 B2 | 10/2005 | Chye et al. |
| 6,972,481 B2 | 12/2005 | Karnezos |
| 7,034,387 B2 | 4/2006 | Karnezos |
| 7,034,388 B2 | 4/2006 | Yang et al. |
| 7,045,887 B2 | 5/2006 | Karnezos |
| 7,049,691 B2 | 5/2006 | Karnezos |
| 7,053,476 B2 | 5/2006 | Karnezos |
| 7,053,477 B2 | 5/2006 | Karnezos et al. |
| 7,057,269 B2 | 6/2006 | Karnezos |
| 7,061,088 B2 | 6/2006 | Karnezos |
| 7,064,426 B2 | 6/2006 | Karnezos |
| 7,071,568 B1 | 7/2006 | St. Amand et al. |
| 7,084,500 B2 | 8/2006 | Swnson et al. |
| 7,090,482 B2 | 8/2006 | Tsukahara et al. |
| 7,093,358 B2 | 8/2006 | Akram et al. |
| 7,101,731 B2 | 9/2006 | Karnezos |
| 7,109,574 B2 | 9/2006 | Chiu et al. |
| 7,115,990 B2 | 10/2006 | Kinsman |
| 7,119,427 B2 | 10/2006 | Kim |
| 7,122,906 B2 * | 10/2006 | Doan ........................... 257/778 |
| 7,176,506 B2 | 2/2007 | Beroz et al. |
| 7,183,191 B2 | 2/2007 | Kinsman et al. |
| 7,190,061 B2 | 3/2007 | Lee |
| 7,218,005 B2 | 5/2007 | Tago |
| 7,221,059 B2 | 5/2007 | Farnworth et al. |
| 7,288,835 B2 | 10/2007 | Yim et al. |
| 7,288,841 B2 | 10/2007 | Yamano |
| 7,298,045 B2 | 11/2007 | Fujitani et al. |
| 7,317,247 B2 | 1/2008 | Lee et al. |
| 7,335,994 B2 | 2/2008 | Klein et al. |
| 7,355,274 B2 | 4/2008 | Lim |
| 7,364,945 B2 | 4/2008 | Shim et al. |
| 7,391,153 B2 | 6/2008 | Suehiro et al. |
| 7,435,619 B2 | 10/2008 | Shim et al. |
| 7,456,035 B2 | 11/2008 | Eliashevich et al. |
| 7,456,088 B2 | 11/2008 | Park et al. |
| 2002/0024124 A1 | 2/2002 | Hashimoto |
| 2002/0096755 A1 | 7/2002 | Fukui et al. |
| 2002/0100955 A1 | 8/2002 | Potter et al. |
| 2002/0130404 A1 | 9/2002 | Ushijima et al. |
| 2003/0008510 A1 | 1/2003 | Grigg et al. |
| 2003/0113952 A1 | 6/2003 | Sambasivam et al. |
| 2003/0153134 A1 | 8/2003 | Kawata et al. |
| 2004/0016939 A1 | 1/2004 | Akiba et al. |
| 2004/0058472 A1 * | 3/2004 | Shim ........................... 438/108 |
| 2004/0061213 A1 | 4/2004 | Karnezos |
| 2004/0124540 A1 | 7/2004 | Chen et al. |
| 2004/0166605 A1 | 8/2004 | Kuratomi et al. |
| 2004/0178499 A1 * | 9/2004 | Mistry et al. ................. 257/734 |
| 2004/0195700 A1 | 10/2004 | Liu |
| 2004/0212096 A1 | 10/2004 | Wang |
| 2005/0051882 A1 | 3/2005 | Kwon et al. |
| 2005/0075053 A1 | 4/2005 | Jung |
| 2006/0043556 A1 | 3/2006 | Su et al. |
| 2006/0065958 A1 | 3/2006 | Tsao et al. |
| 2006/0073635 A1 | 4/2006 | Su et al. |
| 2006/0138631 A1 | 6/2006 | Tao et al. |
| 2006/0189033 A1 | 8/2006 | Kim |
| 2006/0197209 A1 | 9/2006 | Choi et al. |
| 2007/0141751 A1 | 6/2007 | Mistry et al. |
| 2007/0148822 A1 | 6/2007 | Haba et al. |
| 2007/0158809 A1 | 7/2007 | Chow et al. |
| 2007/0166867 A1 | 7/2007 | Chow et al. |

* cited by examiner

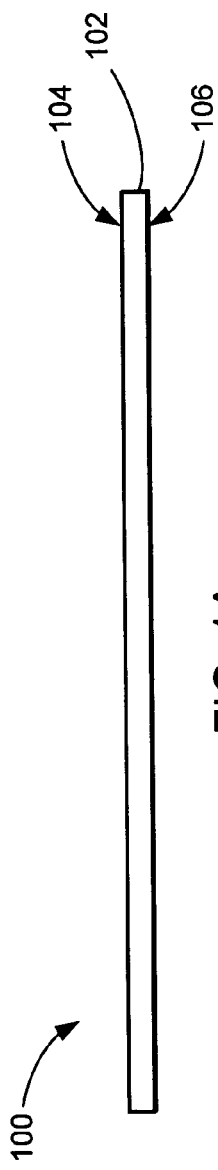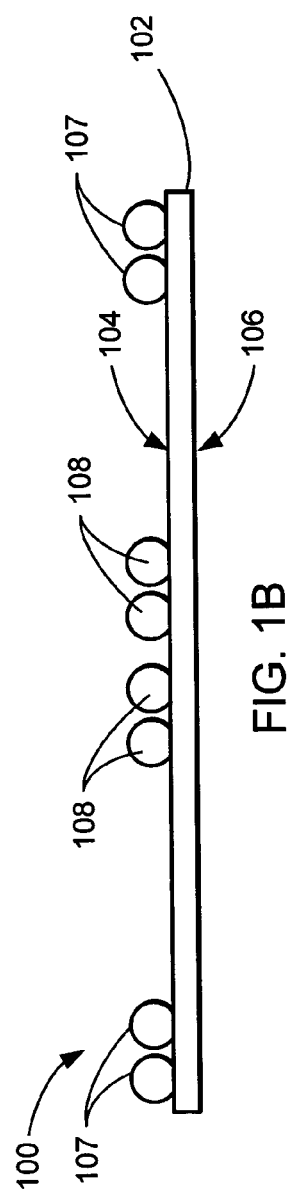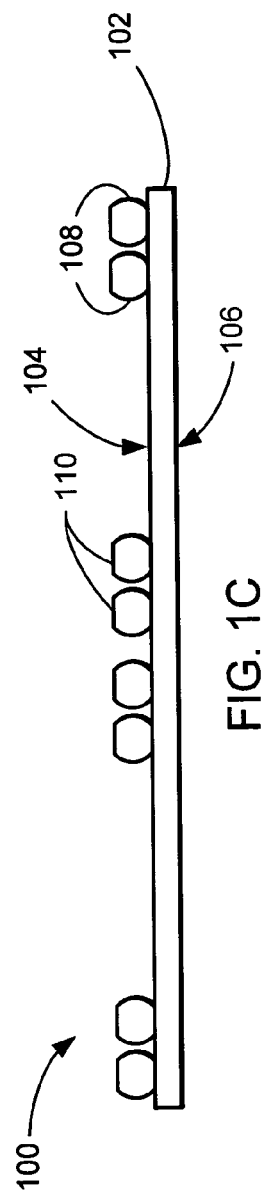

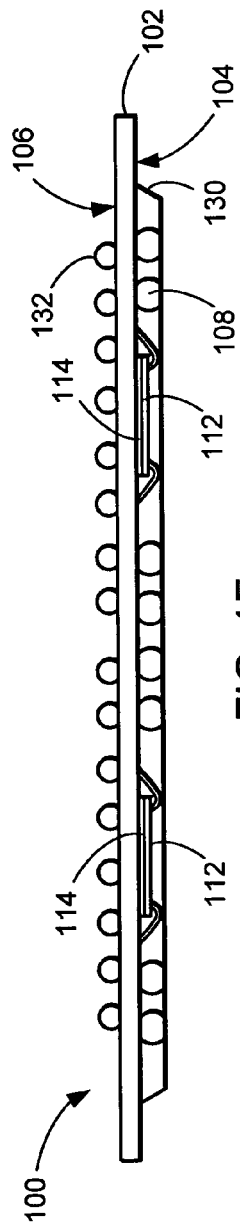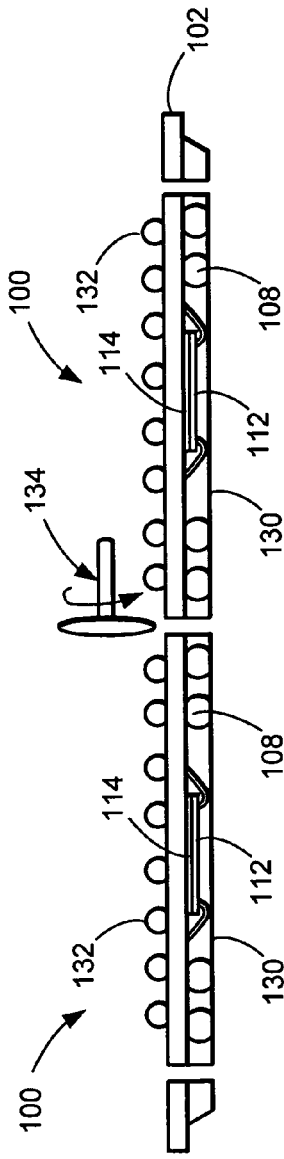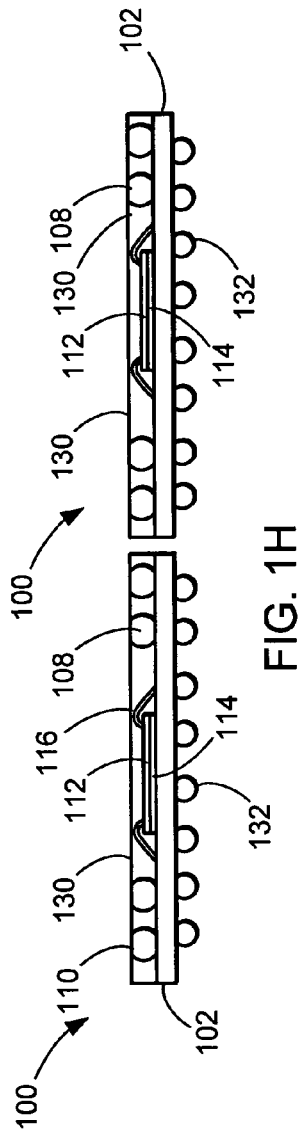

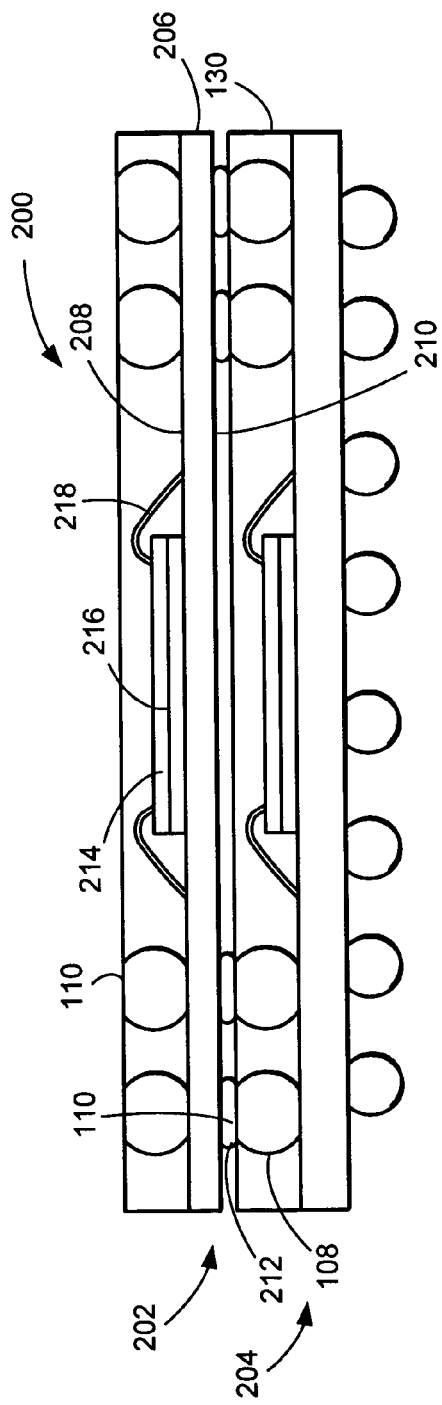
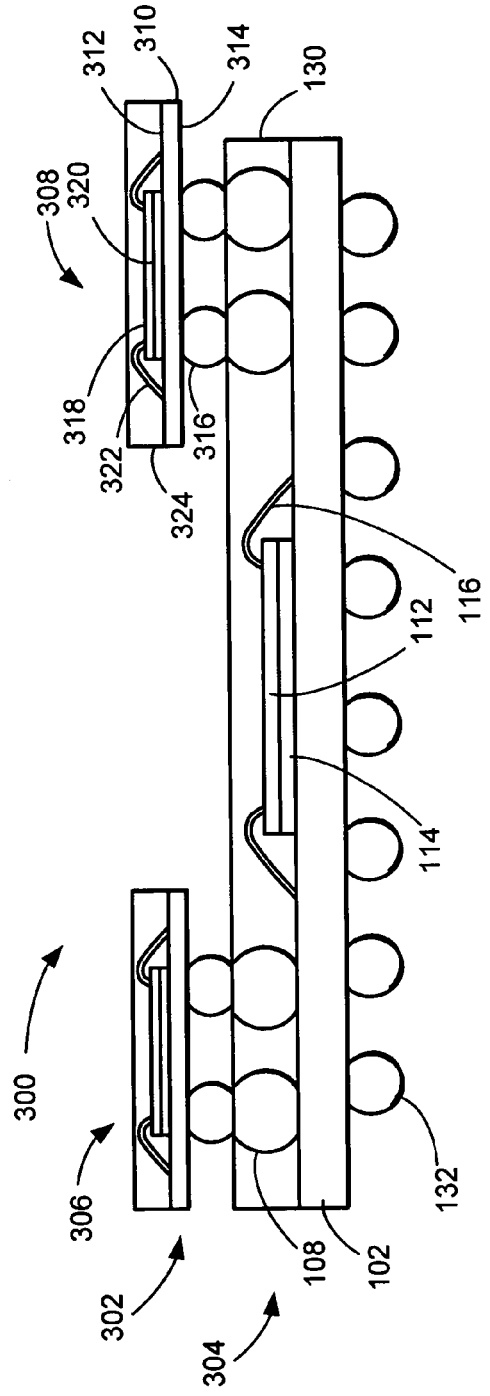
FIG. 2
FIG. 3

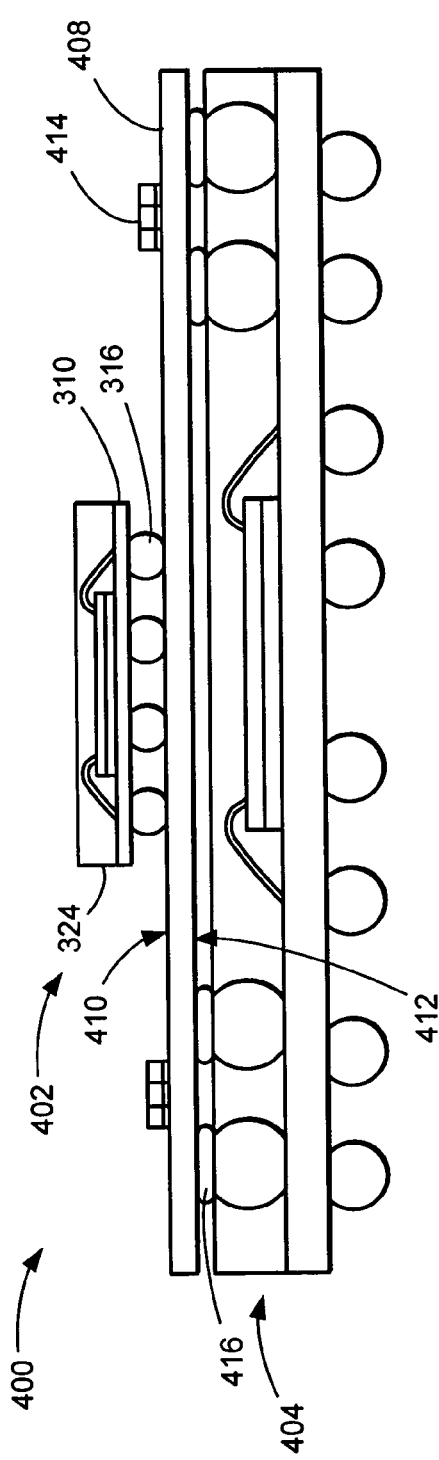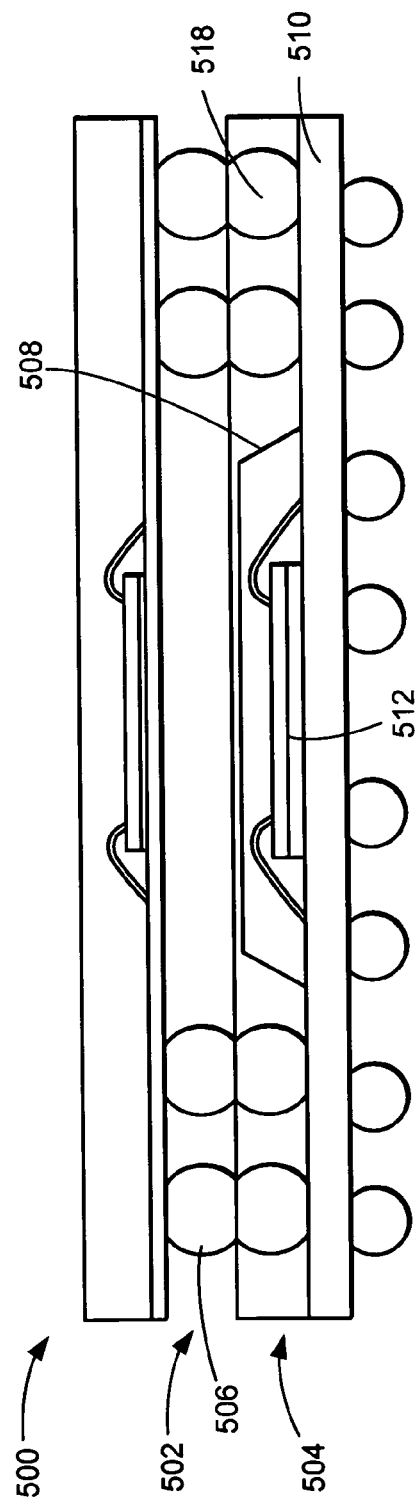

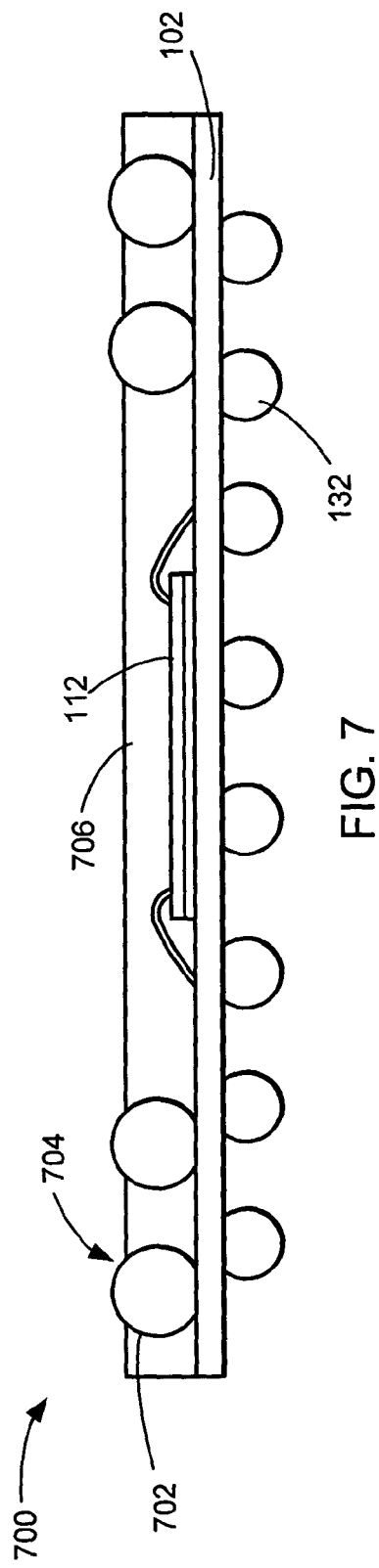
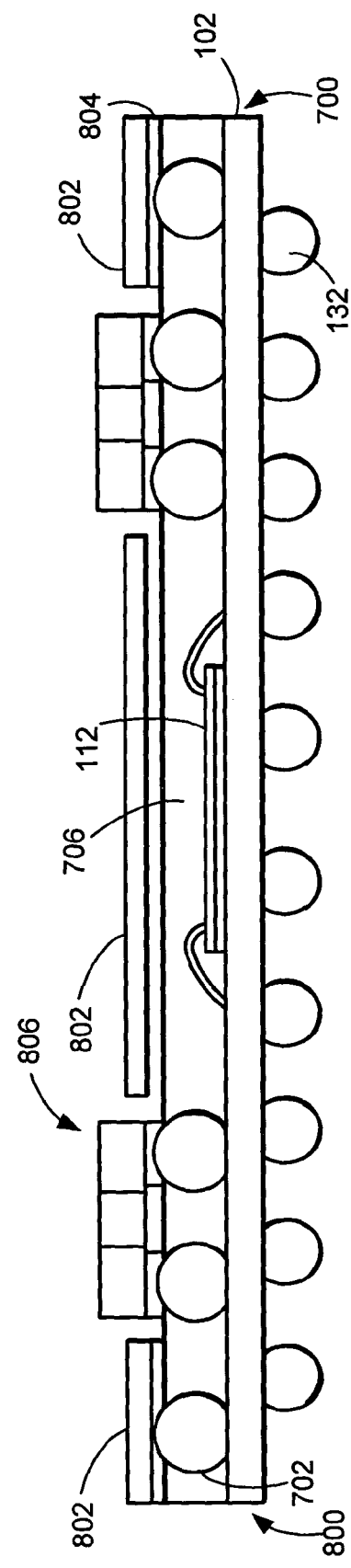

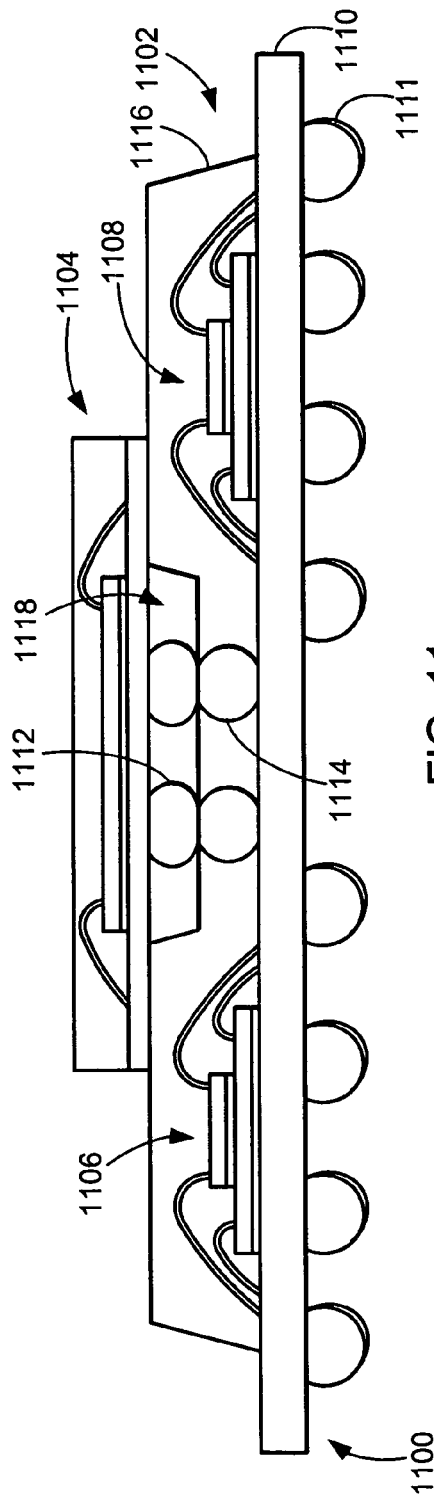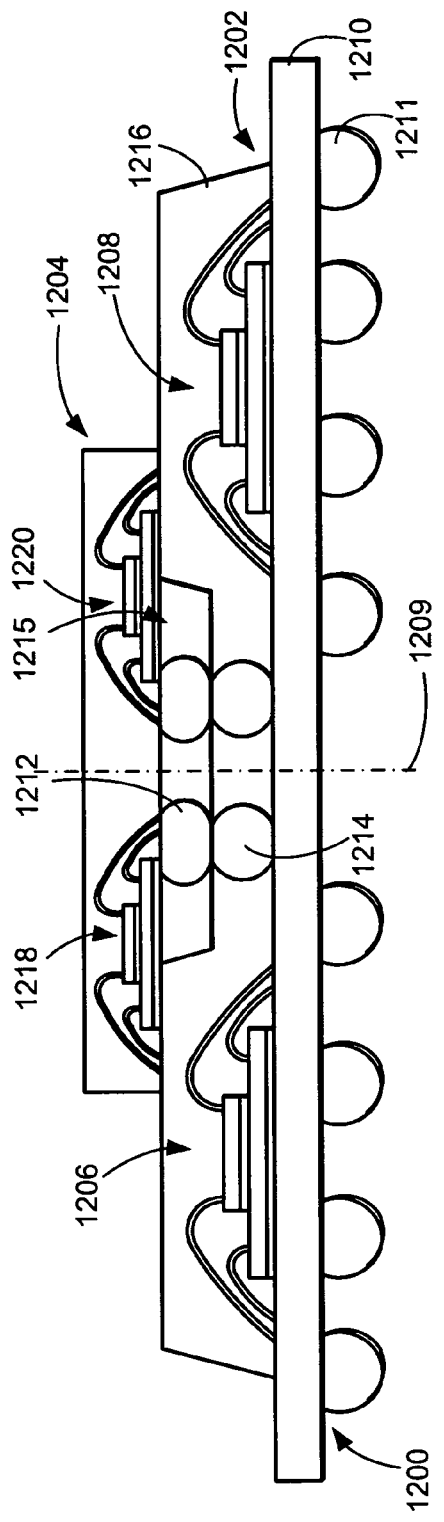

INTEGRATED CIRCUIT PACKAGE SYSTEM WITH EXPOSED INTERCONNECTS

CROSS-REFERENCE TO RELATED APPLICATIONS

The present application contains subject matter related to concurrently filed U.S. patent application Ser. No. 11/307,615, filed Feb. 14, 2006, now U.S. Pat. No. 7,435,619. The related application is assigned to STATS ChipPAC Ltd.

The present application contains subject matter related to U.S. patent application Ser. No. 11/306,627, filed Jan. 4, 2006, now U.S. Pat. No. 7,456,088. The related application is assigned to STATS ChipPAC Ltd.

The present application contains subject matter also related to U.S. patent application Ser. No. 11/326,211, filed Jan. 4, 2006, now U.S. Pat. No. 7,768,125. The related application is assigned to STATS ChipPAC Ltd.

The present application contains subject matter also related to U.S. patent application Ser. No. 11/326,211 by Seng Guan Chow and Heap Hoe Kuan entitled "Multichip Package System" which is identified by. The related application was filed Jan. 4,2006, is assigned to STATS ChipPAC Ltd., and the subject matter thereof is incorporated herein by reference thereto.

The present application contains subject matter also related to U.S. patent application Ser. No. 11/326,206, filed Jan. 4, 2006, now U.S. Pat. No. 7,723,146. The related application is assigned to STATS ChipPAC Ltd.

TECHNICAL FIELD

The present invention relates generally to integrated circuit packages, and more particularly to integrated circuit package systems.

BACKGROUND ART

Advances in semiconductor technology have facilitated the development of smaller and smaller integrated circuits over the past thirty years; presently, industry possesses adequate technology to fabricate computers, telephones, scanners and video cameras, which can fit within in the pahn of the hand. These devices also tend to be more affordable than their larger predecessors. The design of smaller and smaller integrated circuits has allowed these size reductions.

Conventionally, the integrated circuits are mounted to a carrier, the use of which facilitates testing of the integrated circuit prior to mounting to a printed circuit board (PCB). The use of a carrier also enables redistribution of the input and output connections to be more compatible with PCB technology, and replacement of defective integrated circuits following mounting.

Typically, the carrier is larger than the integrated circuit itself and together, the integrated circuit and carrier form a "package", which is individually mounted to a PCB, which can mount many integrated circuits and have a number of off-board connections for connecting other PCBs.

As the size of the integrated circuit continues to decrease, however, it is increasingly difficult to obtain further reductions in package size by relying solely upon reductions in the size of the integrated circuit. To achieve further package size reductions, recent design efforts have been devoted toward space savings achieved by stacking integrated circuits vertically on top of one another, especially in connection with memory technology. These design efforts have generally focused on providing ever-increasing numbers of integrated circuits into a smaller and smaller space, to thereby enable design of even smaller computers, telephones, scanners, video cameras, and other electronic devices.

The design efforts devoted toward stacking integrated circuits typically employ a special carrier, which has wire leads that extend laterally from the package for mounting to a peripheral frame. The peripheral frame provides structural support for the packages, and also carries an electrical bus for connection to the individual wire leads of each package. The vertically stacked packages are then encapsulated to be made moisture resistant, and are eventually mounted as a single unit to the PCB.

For the space savings achieved, however, the recent design efforts have required a relatively labor intensive and costly assembly process between separate packages. In addition, because the integrated circuits generate heat during operation, one design consideration is the presence of structure, which permits heat to escape from within the stacked packages, for dissipation outside the frame, although such structure generally further adds to the cost and complexity of the assembly.

There exists a definite need for a three-dimensional integrated circuit assembly, useable for both memory integrated circuits and other integrated circuits that provides for easy and efficient assembly and electrical connection of the vertically stacked integrated circuits. Preferably, such an assembly should be very low-cost and be compatible with existing interconnects and PCB technology. Further still, such an assembly should include an efficient method of heat dissipation.

As electronic circuits become larger and more complex, increased efforts continue to be directed toward the goal of decreasing size of circuit packages. In some types of packages, many integrated circuits are mounted side by side in close proximity to one another on a multi-layered substrate so that adjacent integrated circuits may be connected to one another by means of connecting leads that extend in a number of different planes, thereby decreasing horizontal dimensions of the package at the expense of some increase in vertical dimension.

Integrated circuits have also been stacked vertically one upon another to provide decreased size, weight and power as compared to single integrated circuit or multiple horizontally aligned integrated circuit packaging. However, because of the large number of integrated circuit connecting pads, which may be in excess of four hundred on a single integrated circuit, it has been difficult for integrated circuit stacking to adequately provide interconnections from all of the integrated circuit pads to one another as desired, or to external circuitry.

In other integrated circuit stacking arrangements, interconnecting leads between integrated circuits on different levels are provided at the sides of the stack. Leads are routed from each integrated circuit connecting pad to the side of the stack, and interconnections are made in the form of vertical connectors or vertical buses that extend along the exterior sides of the stack. Because the vertical surface area of the sides of the stack is limited, the number of input/output connections between the integrated circuit connecting pads of the integrated circuits of a stack and connecting elements at the outside of the stack is itself severely limited. In prior integrated circuit stacks, connecting leads from the integrated circuit connecting pads have been routed to one side of the stack so as to most conveniently form the vertical interconnects between stack layers and connections. This has been accomplished by adding metallization or additional leads on the integrated circuit or using other connection techniques, such as tape automated bonding. These techniques require special processing of the integrated circuits or wafers and add considerable cost to the stacking process.

In conventional stacked package structures for area array packages, the top package normally has at least a package size to clear the bottom mold cap size with solder balls having a large diameter, as well as a large ball pitch size, arranged in the peripheral area. As a result, the unnecessary large package size may be required to match the bottom package footprint.

The electronic industry continues to seek products that are lighter, faster, smaller, multi-functional, more reliable and more cost-effective. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including providing a substrate having a first surface and second surface; mounting interconnects to the first surface; mounting integrated circuit dies to the first surface; embedding the interconnects and the integrated circuit die within an encapsulant on the substrate and leaving top portions of the interconnects exposed; attaching solder balls to the second surface; and singulating the substrate and the encapsulant into a plurality of integrated circuit packages.

Certain embodiments of the invention have other advantages in addition to or in place of those mentioned or obvious from the above. The advantages will become apparent to those skilled in the art from a reading of the following detailed description when taken with reference to the accompanying drawings.

BRIEF DESCRIPTION OF THE DRAWINGS

FIG. 1A is a cross-sectional view of an integrated circuit package system in an intermediate stage of manufacturing in accordance with an embodiment of the present invention;

FIG. 1B is the structure of FIG. 1A in an interconnects attachment stage;

FIG. 1C is the structure of FIG. 1B in a planarization stage;

FIG. 1F is the structure of FIG. 1E in a solder reflow stage;

FIG. 1G is the structure of FIG. 1F in a singulation stage;

FIG. 1H is a cross-sectional view of singulated integrated circuit packages;

FIG. 2 is a cross-sectional view of an integrated circuit package system in accordance with a first embodiment of the present invention;

FIG. 3 is a cross-sectional view of an integrated circuit package system in accordance with a second embodiment of the present invention;

FIG. 4 is a cross-sectional view of an integrated circuit package system in accordance with a third embodiment of the present invention;

FIG. 5 is a cross-sectional view of an integrated circuit package system in accordance with a fourth embodiment of the present invention;

FIG. 7 is a cross-sectional view of an integrated circuit package in accordance with a further embodiment of the present invention;

FIG. 8 is a cross-sectional view of an integrated circuit package system in accordance with a fifth embodiment of the present invention;

FIG. 11 is a cross-sectional view of an integrated circuit package system in accordance with a ninth embodiment of the present invention;

FIG. 12 is a cross-sectional view of an integrated circuit package system in accordance with a tenth embodiment of the present invention.

BEST MODE FOR CARRYING OUT THE INVENTION

Figure 1D:
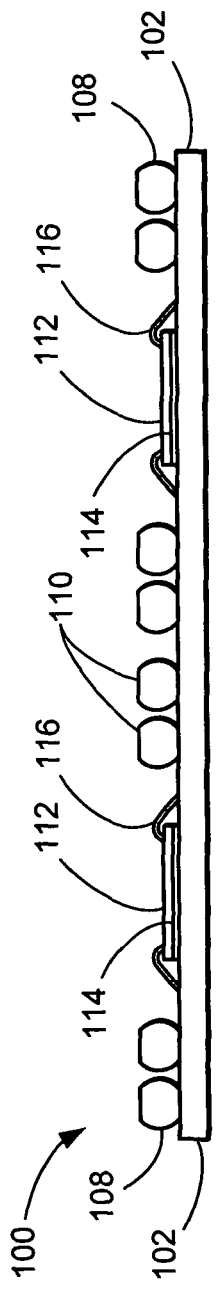
FIG. 1D is the structure of FIG. 1C in an integrated circuit die attaching stage.

In the following description, numerous specific details are given to provide a thorough understanding of the invention. However, it will be apparent that the invention may be practiced without these specific details. In order to avoid obscuring the present invention, some well-known circuits, system configurations, and process stages are not disclosed in detail.

Likewise, the drawings showing embodiments of the device are semi-diagrammatic and not to scale and, particularly, some of the dimensions are for the clarity of presentation and are shown greatly exaggerated in the drawing FIGs. Similarly, although the sectional views in the drawings for ease of description show the exit ends of orifices as oriented downward, this arrangement in the FIGs. is arbitrary and is not intended to suggest that the delivery path should necessarily be in a downward direction. Generally, the device can be operated in any orientation. Also, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" refers to direct contact between elements.

The term "processing" as used herein includes deposition of material or photoresist, patterning, exposure, development, etching, cleaning, and/or removal of the material or photoresist as required in forming a described structure.

Referring now to FIG. 1A, therein is shown a cross-sectional view of an integrated circuit package 100 in an intermediate stage of manufacturing in accordance with an embodiment of the present invention. A substrate 102 has a first surface 104 and a second surface 106. The substrate 102 may be made of a material containing a rigid laminate glass epoxy resin, a flexible tape, a ceramic, an inorganic material, a low dielectric material, or a semiconductor material (such as silicon or gallium arsenic).

Referring now to FIG. 1B, therein is shown the structure of FIG. 1A in an interconnects attachment stage in accordance with an embodiment of the present invention. Interconnects 108 are attached to the first surface 104. The interconnects 108 can be made from any shape such as a sphere or spheroidal shape. The interconnects 108 can be made from a material comprising: Sn, Pb, Au, Cu, metal alloys or any other conductive material. The size of the interconnects 108 may not necessarily be larger than a BGA ball, but may be dependent upon the BGA ball pitch/size of the package to be mounted.

Referring now to FIG. 1C, therein is shown the structure of FIG. 1B in a planarization stage in accordance with an embodiment of the present invention. The top portions of the interconnects 108 are deformed or planarized creating flat-tops 110. The planarization stage may be accomplished, for example, with a coining process, a pressing process, a polishing process, or a lapping process.

Referring now to FIG. 1D, therein is shown the structure of FIG. 1C in an integrated circuit die attaching stage in accordance with an embodiment of the present invention. At least one integrated circuit die 112 is attached next to the interconnects 108 on the first surface 104 of the substrate 102 with an adhesive material 114. Wires 116 electrically connect the integrated circuit die 112 to wiring in the first surface 104 of the substrate 102.

Figure 1E:
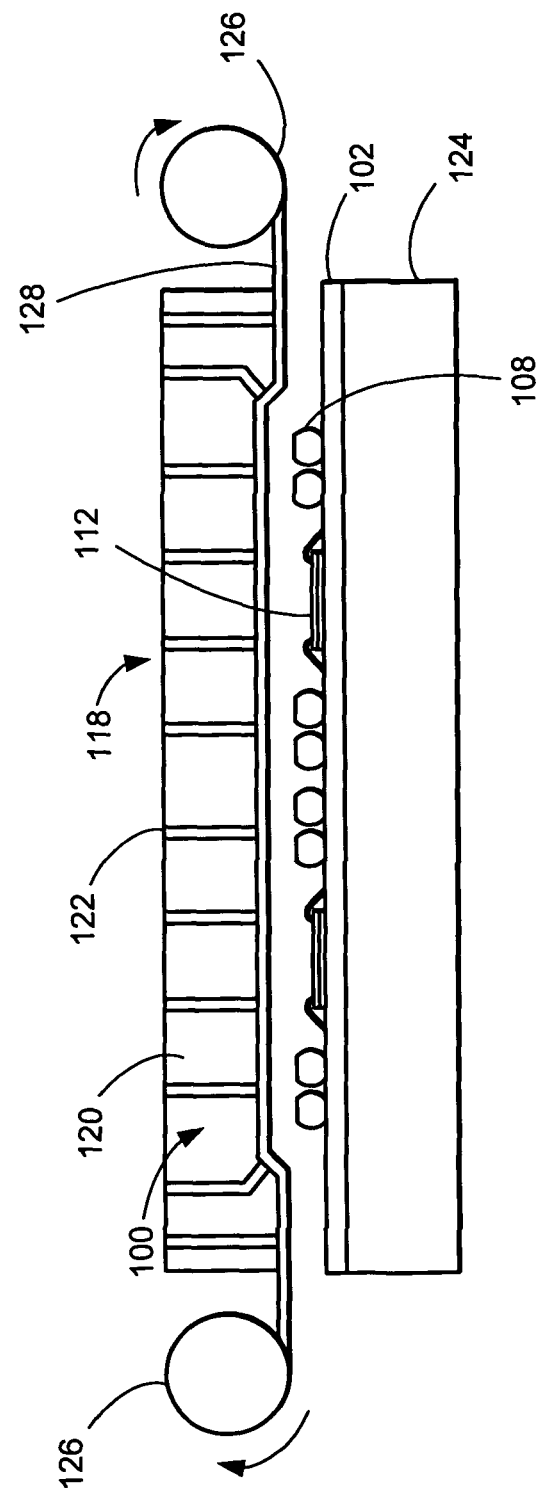
FIG. 1E is the structure of FIG. 1D in a transfer molding process stage.

Referring now to FIG. 1E, therein is shown the structure of FIG. 1D in a transfer molding process stage in accordance with an embodiment of the present invention. The structure of FIG. 1D is loaded onto a mold chase 118. The mold chase 118 includes a top mold chase 120 having vacuum suction holes 122, and a bottom mold chase 124.

Rollers 126 deploy a film 128 adjacent to the top 120 of the mold chase 118. A vacuum is applied to the vacuum suction holes 122 to draw the film 128 against the top 120. The structure of FIG. 1D undergoes a transfer molding process using, for example, Film-Assisted Molding (FAM) equipment. An encapsulant 130 is injected into the closed mold chase 118 where the film 128 is pressed against the top of the exposed top surfaces of the solder balls 108. The encapsulant 130 is cured to be coplanar with the flat-tops 110 of the solder balls 108.

Referring now to FIG. 1F, therein is shown the structure of FIG. 1E in a solder reflow stage in accordance with an embodiment of the present invention. The structure of FIG. 1E is flipped over and solder balls 132 are mounted to wiring in the second surface 106 of the substrate 102 by a solder reflow process. The encapsulant 130 is shown in direct contact with the interconnects 108.

Referring now to FIG. 1G, therein is shown the structure of FIG. 1F in a singulation stage in accordance with an embodiment of the present invention. A saw blade 134 saws the substrate 102 and the encapsulant 130 into the integrated circuit packages 100.

Referring now to FIG. 1H, therein is shown cross-sectional views of the integrated circuit packages 100 in accordance with an embodiment of the present invention. The integrated circuit packages 100 have been turned upright. The solder balls 132 are under the substrates 102. The integrated circuit dies 112, the adhesive material 114, the wires 116, and the interconnects 108 are embedded within the encapsulant 130 with the flat-tops 110 of the interconnects 108 exposed. In accordance with another embodiment, a deflash process may be performed if mold flash occurs on the flat-tops 110 of the interconnects 108.

Referring now to FIG. 2, therein is shown a cross-sectional view of an integrated circuit package system 200 in accordance with a first embodiment of the present invention. It will be noted that the numbering of the embodiments is merely for convenience and ease of understanding of the invention.

The integrated circuit package system 200 includes a first integrated circuit package 202 stacked on a second integrated circuit package 204.

The first integrated circuit package 202 may include an area array package, such as for example, conventional BGA, LGA, flip chip, or other similar chip with or without interconnects. The first integrated circuit package 202 includes a substrate 206 having a first surface 208 and a second surface 210. Solder joints 212 are attached to wiring on the second surface 210. An integrated circuit die 214 is mounted to the first surface 208 with an adhesive material 216. The integrated circuit die 214 is electrically connected to wiring on the first surface 208 by wires 218.

The second integrated circuit package 204 includes a similar structure to the integrated circuit package 100. The first integrated circuit package 202 is stacked on top of the second integrated circuit package 204. The flat-tops 110 of the interconnects 108 are connected to the solder joints 212.

Referring now to FIG. 3, therein is shown is a cross-sectional view of an integrated circuit package system 300 in accordance with a second embodiment of the present invention. The integrated circuit package system 300 includes first integrated circuit packages 302 and a second integrated circuit package 304. The first integrated circuit packages 302 are small footprint packages, which together are smaller than the second integrated circuit package 304, and comprise a first package 306 and a second package 308. Both the first package 306 and the second package 308, each include a substrate 310 having a first surface 312 and a second surface 314. Solder balls 316 are attached to wiring on the second surface 314. An integrated circuit die 318 is mounted to the first surface 312 with an adhesive material 320. Wires 322 electrically connect the integrated circuit die 318 to wiring on the first surface 312 of the substrate 310. The integrated circuit die 318, the adhesive material 320, and the wires 322 are embedded within an encapsulant 324.

The second integrated circuit package 304 includes a similar structure to the integrated circuit package 100. The first integrated circuit package 302 is stacked on top of the second integrated circuit package 304. The solder balls 316 electrically connect the interconnects 108 to the substrate 310. This embodiment obviates the need for the first integrated circuit package 302 with unnecessary large footprint to match with the second integrated circuit package 304. Therefore, the 3D package can be manufactured in a more efficient and cost effective manner. This embodiment may shorten the signal connection paths between the first integrated circuit package 302 and the second integrated circuit package 304. Furthermore, passive components, such as capacitors, resistors, etc., may be mounted on top of the integrated circuit package system 300.

Referring now to FIG. 4, therein is shown a cross-sectional view of an integrated circuit package system 400 in accordance with third embodiment of the present invention. The integrated circuit package system 400 stacks a first integrated circuit package 402 and a second integrated circuit package 404. The first integrated circuit package 402 includes a small footprint top package similar to the first package 306 and the second package 308.

Between the first integrated circuit package 402 and the second integrated circuit package 404 is an interposer 408 having a first surface 410 and a second surface 412. The interposer 408 is made of a material such as rigid laminate glass epoxy resin, flexible tape, ceramic, inorganic materials, low dielectric materials, or semi conductor materials (such as silicon, gallium arsenic). Passive components 414 and the first integrated circuit package 402 are mounted to the first surface 410 of the interposer 408. Solder balls 316 electrically connect the interposer 408 and the substrate 310.

The second integrated circuit package 404 includes a similar structure to the integrated circuit package 100. The interposer 408 and the first integrated circuit package 402 are stacked above the second integrated circuit package 404. Solder joints 416 electrically connect the interposer 408 and the second integrated circuit package 404.

Referring now to FIG. 5, therein is shown a cross-sectional view of an integrated circuit package system 500 in accordance with fourth embodiment of the present invention. The integrated circuit package system 500 includes a first integrated circuit package 502 and a second integrated circuit package 504. Solder joints 506 electrically connect the first integrated circuit package 502 and the second integrated circuit package 504. The first integrated circuit package 502 includes a similar structure to the first integrated circuit package 202 of FIG. 2. The second integrated circuit package 504 includes a similar structure to the integrated circuit package 100. Furthermore, the second integrated circuit package 504 includes an internal encapsulant 508 or molding compound. For the ease of handling during known good die and manufacturing processes, the substrate with pre-encapsulated or pre-molded die can be provided prior to forming the interconnects 518 in the second integrated circuit package 504.

Figure 6A:
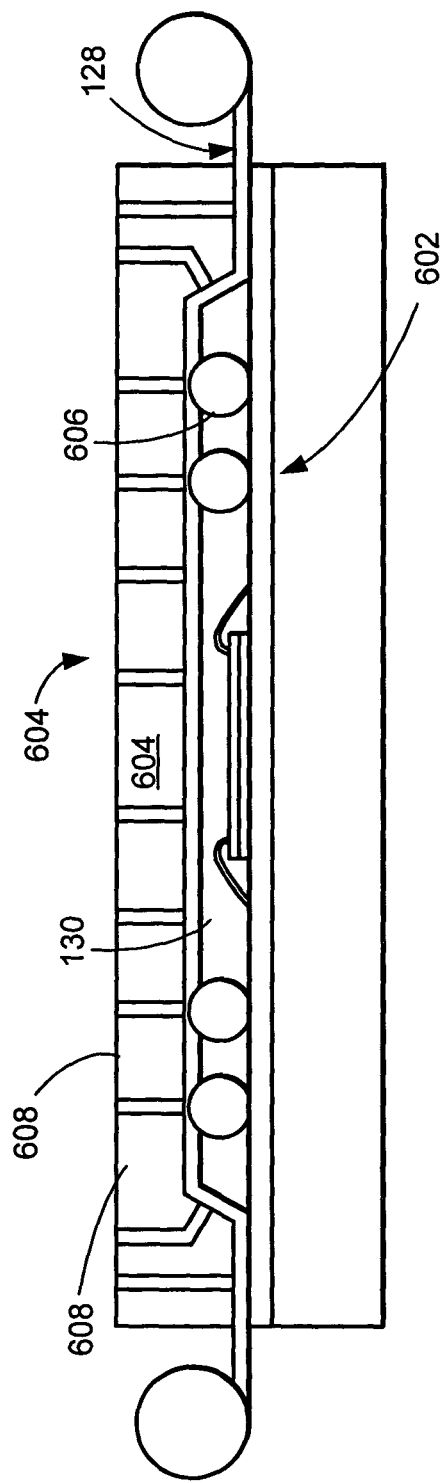
FIG. 6A is a cross-sectional view of an integrated circuit package system in a transfer molding process stage in accordance with another embodiment of the present invention.

FIG. 6A is a cross-sectional view of an integrated circuit package system in a transfer molding process stage of manufacturing in accordance with another embodiment of the present invention. An integrated circuit package 602 in an intermediate stage of manufacture is loaded onto a mold chase 604. The integrated circuit package 602 is similar to the structure of FIG. 1D. However, solder balls 606 do not include the flat-tops 110 of the structure in FIG. 1D. With mold chase 604 (film-assisted molding machine), solder balls 606 can be partially exposed from the encapsulant 130 during the molding process. The mold chase 604 has a top mold chase 608 with the top of the inside being flat since the film 128 is flexible and conformable to a top contour of solder balls 606.

Figure 6B:
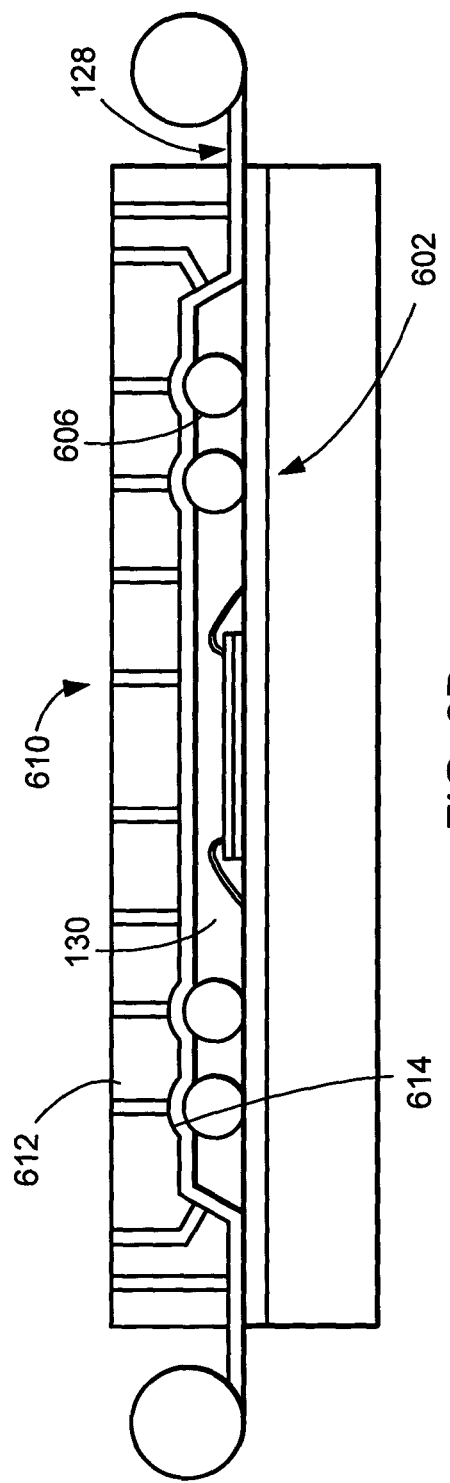
FIG. 6B is a cross-sectional view of an integrated circuit package system in a transfer molding process stage in accordance with still another embodiment of the present invention.

FIG. 6B is a cross-sectional view of an integrated circuit package system in a transfer molding process stage of manufacturing in accordance with another embodiment of the present invention. The integrated circuit package 602 is loaded onto a mold chase 610. With the mold chase 610 (film-assisted molding machine), the solder balls 606 can be partially exposed after molding process. The mold chase 610 includes a top mold chase 612 with cavities 614. The top mold chase 612 with the cavities 614 in the top of the inside can be used to compensate for a higher standoff of the solder balls 606 over the encapsulant 130.

Referring now to FIG. 7, therein is shown a cross-sectional view of an integrated circuit package 700 in accordance with another embodiment of the present invention. The structure of the integrated circuit package 700 is similar to the integrated circuit package 100. However, interconnects 702 include a protrusion 704 in the form of a partially exposed tip, which extends out from encapsulant 706. The protrusion 704 can be used as a stencil alignment guide for solder paste printing process, or as a saw alignment reference. Solder paste can be deposited with a controlled thickness being higher than the partial exposed solder ball tips using screen printing or dispensing method. The protrusion 704 may have a higher melting point to help control the solder joint thickness of LGA connected on top. Partial or all of the protrusion 704 can be flattened out by any of these methods known to skilled in the art; e.g., coining, pressing, polishing, or lapping.

Optionally, interconnects 702 can be flattened out during the molding stage since the interconnects 702, which are pre-attached, are characterized in having such softness that they will deform under the mold chase clamping force so as to not cause damage to the substrate.

Referring now to FIG. 8, therein is shown a cross-sectional view of an integrated circuit package system 800 in accordance with another embodiment of the present invention. The integrated circuit package system 800 includes the integrated circuit package 700. A heat sink shield 802 is mounted to the interconnects 702 with a thermal interface material 804. The thickness of the thermal interface material 804 can be controlled with the use of the protrusion 704. Passive components 806 are mounted to the interconnects 702. The heat sink shield 802, which is grounded to substrate 102 through the connection of the interconnects 702, can also serve as a radio frequency shielding member.

Figure 9:
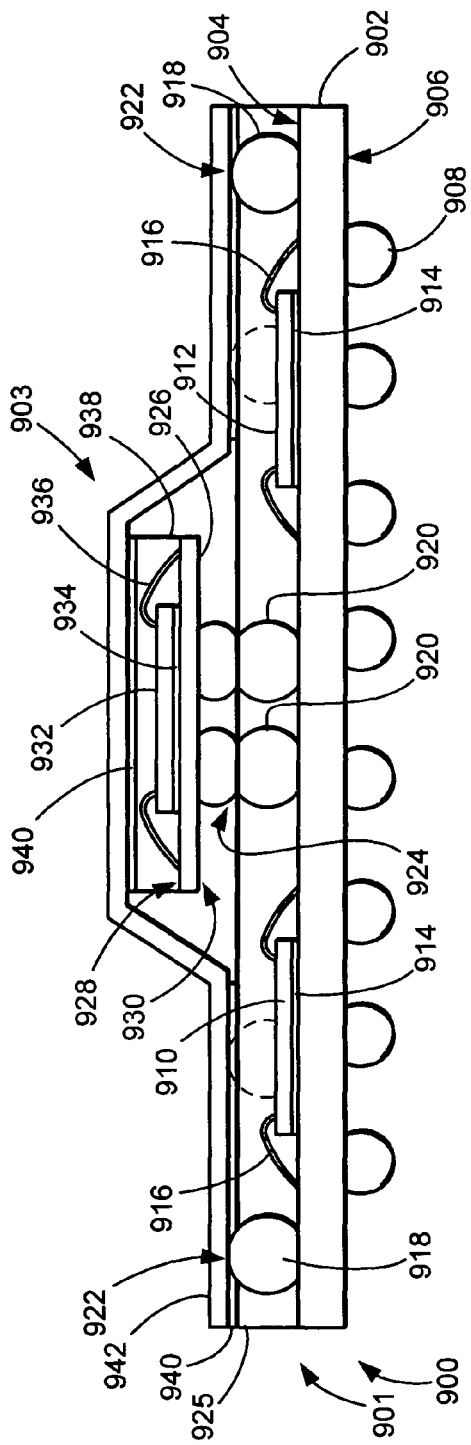
FIG. 9 is a cross-sectional view of an integrated circuit package system in accordance with a seventh embodiment of the present invention.

Referring now to FIG. 9, therein is shown a cross-sectional view of an integrated circuit package system 900 in accordance with another embodiment of the present invention. The integrated circuit package system 900 includes a first integrated circuit package 901 and a second integrated circuit package 903. The second integrated circuit package 903 is mounted over the first integrated circuit package 901.

The first integrated circuit package 901 includes a substrate 902 having a first surface 904 and a second surface 906. Solder balls 908 are mounted to wiring on the second surface 906. A first integrated circuit die 910 and a second integrated circuit die 912 are mounted to the first surface 904 of the substrate 902 with an adhesive material 914. Wires 916 electrically connect the first integrated circuit die 910 and the second integrated circuit die 912 to wiring on the first surface 904 of the substrate 902. A first set of interconnects 918 and a second set of interconnects 920 are mounted to wiring on the first surface 904 of the substrate 902. The first set of interconnects 918 includes exposed top portions 922. The second set of interconnects 920 includes planarized top portions 924. The first set of interconnects 918, the second set of interconnects 920, the first integrated circuit die 910, the second integrated circuit die 912, the adhesive material 914 and the wires 916 are embedded within a first encapsulant 925. The exposed top portions 924 of the first set of interconnects 918 can protrude above a top surface of the first encapsulant 925. The planarized top portions 924 of the second set of interconnects 920 can be coplanar with the top surface of the first encapsulant 925.

The second integrated circuit package 903 includes a substrate 926 having a first surface 928 and a second surface 930. A third integrated circuit die 932 is mounted to the first surface 928 of the substrate 926 with an adhesive material 934. Wires 936 electrically connect the third integrated circuit die 932 and the first surface 928 of the substrate 926. The third integrated circuit die 932, the adhesive material 934, the wires 936 are embedded within a second encapsulant 938. A thermal interface material 940, such as a conductive grease or solder, is attached to the first encapsulant 925, the second encapsulant 938, and the exposed top portions 922 of the first set of interconnects 918. A heat sink shield 942 is attached to the thermal interface material 940.

Figure 10:
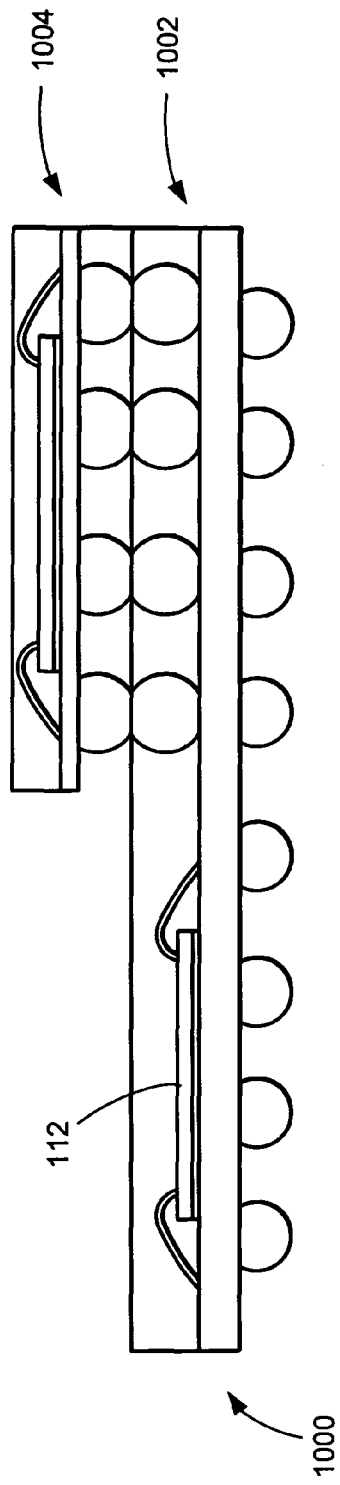
FIG. 10 is a cross-sectional view of an integrated circuit package system in accordance with an eighth embodiment of the present invention.

Referring now to FIG. 10, therein is shown a cross-sectional view of an integrated circuit package system 1000 in accordance with another embodiment of the present invention. The integrated circuit package system 1000 includes a first integrated circuit package 1002 and a second integrated circuit package 1004. The second integrated circuit package 1004 is mounted on the first integrated circuit package 1002.

The structure of the first integrated circuit package 1002 is similar to that of the integrated circuit package 100 except that the integrated circuit die 112 includes an off-center lateral orientation/position with respect to the substrate 102. The position of the integrated circuit die 112 can be offset from the substrate center to its edge to provide more room and flexibility to accommodate a customized ball layout its other edge.

Referring now to FIG. 11, therein is shown a cross-sectional view of an integrated circuit package system 1100 in accordance with another embodiment of the present invention. The integrated circuit package system 1100 includes a first integrated circuit package 1102 and a second integrated circuit package 1104. The second integrated circuit package 1104 is mounted on the first integrated circuit package 1102.

The first integrated circuit package 1102 includes a first stacked integrated circuit die structure 1106 and a second stacked integrated circuit die structure 1108 mounted on a substrate 1110. Solder balls 1111 are mounted to wiring on an underside of the substrate 1110. Interconnects 1114 having flat-tops are mounted to wiring on the substrate 1110. The first stacked integrated circuit die structure 1106, the second stacked integrated circuit die structure 1108, and the interconnects 1114 are embedded within an encapsulant 1116.

The second integrated circuit package 1104 can be mounted by solder balls 1112 within a recess 1118 in the encapsulant 1116 on the interconnects 1114. The encapsulant 1116 is on the substrate 1110 in two thicknesses over the first stacked integrated circuit die structure 1106 and the second stacked integrated circuit die structure 1108 and around the interconnects 1114 with top portions of the interconnects 1114 exposed and level with the encapsulant 1116. The encapsulant 1116 has a thickness around the first stacked integrated circuit die structure 1106 and the second stacked integrated circuit die structure 1108 thicker than around the interconnects 1114. The solder balls 1112 of the second integrated circuit package 1104 can be pre-dipped with solder flux (not shown) to form the required interconnection between the second integrated circuit package 1104 and the solder balls 1112 in the recess 1118. Alternatively, an anisotropic conductive adhesive (not shown) can be deposited into the recess 1118.

Referring now to FIG. 12, therein is shown a cross-sectional view of an integrated circuit package system 1200 in accordance with another embodiment of the present invention. The integrated circuit package system 1200 includes a first integrated circuit package 1202 and a second integrated circuit package 1204. The second integrated circuit package 1204 is mounted on the first integrated circuit package 1202.

The first integrated circuit package 1202 includes a first stacked integrated circuit die structure 1206 and a second stacked integrated circuit die structure 1208 mounted symmetrically about a vertical plane 1209 on the substrate 1210. Solder balls 1211 are mounted to wiring on an underside of the substrate 1210. Interconnects 1214 having flat-tops are mounted to wiring on the substrate 1210. The first stacked integrated circuit die structure 1206, the second stacked integrated circuit die structure 1208, and the interconnects 1214 are embedded within an encapsulant 1216. The encapsulant 1216 is on the substrate 1210 in two thicknesses over the first stacked integrated circuit die structure 1206 and the second stacked integrated circuit die structure 1208 and around the interconnects 1214 with top portions of the interconnects 1214 exposed and level with the encapsulant 1216. The encapsulant 1216 has a thickness around the first stacked integrated circuit die structure 1206 and the second stacked integrated circuit die structure 1208 thicker than around the interconnects 1214.

The second integrated circuit package 1204 contains a third integrated circuit package 1218 and a fourth integrated circuit package 1220 also symmetrically mounted about the axis 1209. The second integrated circuit package 1204 can be mounted by solder balls 1212 within a recess 1215 in the encapsulant 1216 on the interconnects 1214. The solder balls 1212 of the second integrated circuit package 1104 can be pre-dipped with solder flux (not shown) to form the required interconnection between the second integrated circuit package 1204 and the solder balls 1212 in the recess 1215. Alternatively, an anisotropic conductive adhesive (not shown) can be deposited into the recess 1218.

The vertical plane 1209 may serve as a singulation line to divide the integrated circuit package system 1200 into two halves, which form two separate integrated circuit package systems.

Figure 13:
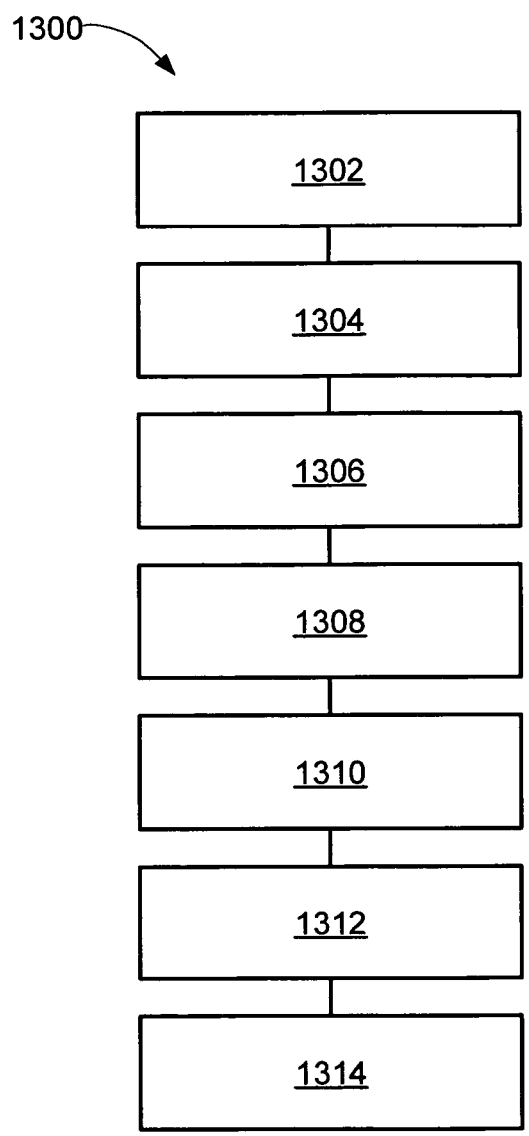
FIG. 13 is a flow chart of a system for making an integrated circuit package system in accordance with an embodiment of the present invention.

Referring now to FIG. 13, therein is shown a flow chart of an integrated circuit package system for making an integrated circuit package system in accordance with an embodiment of the present invention. The system 1300 includes providing a substrate having a first surface and second surface in a block 1302; mounting interconnects to the first surface in a block 1304; mounting integrated circuit dies to the first surface in a block 1306; embedding the interconnects and the integrated circuit die within an encapsulant on the substrate and leaving top portions of the interconnects exposed in a block 1308; performing a transfer mold process on the assembled substrate in a block 1310; attaching solder balls to the second surface in a block 1312; and singulating the substrate and the encapsulant into a plurality of integrated circuit packages in a block 1314.

In greater detail, a method for making an integrated circuit package system according to an embodiment of the present invention, is performed as follows:
1. providing a substrate. (FIG. 1A)
2. attaching interconnects on top of the substrate. (FIG. 1B)
3. planarizing the interconnects (FIG. 1C)
4. attaching at least one integrated circuit die on the substrate and bond with wires. (FIG. 1D)
5. performing a transfer mold process on the assembled substrate. (FIG. 1E)
6. attaching solder balls to the substrate. (FIG. 1F)
7. singulating the unit by a sawing process. (FIG. 1G)

The resulting processes and configurations are straightforward, cost-effective, uncomplicated, highly versatile and effective, can be implemented by adapting known technologies, and are thus readily suited for efficiently and economically manufacturing large die integrated circuit packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method of manufacture of an integrated circuit package system comprising:
   providing a substrate having a first surface and a second surface;
   mounting a first set of interconnects to the first surface, the first set of interconnects having exposed top portions and at least partial spheroidal shapes;
   mounting a second set of interconnects to the first surface the second set of interconnects having planarized top portions;
   mounting an integrated circuit die to the first surface; and
   forming an encapsulant on the substrate in two thicknesses around the integrated circuit die and the interconnects, with the exposed top portions protruding above a top surface of the encapsulant and the planarized top portions coplanar with the top surface of the encapsulant.

2. The method as claimed in claim 1 wherein:
   forming the encapsulant includes forming the encapsulant having a first thickness around the integrated circuit die and a second thickness around the second set of interconnects.

3. The method as claimed in claim 1 wherein:
   forming the encapsulant in two thicknesses includes forming the encapsulant having a first thickness around the second set of interconnects and a second thickness around integrated circuit die, the first thickness is thicker than the second thickness.

4. The method as claimed in claim 1 wherein:
   mounting the second set of interconnects further comprises planarizing the second set of interconnects to have the planarized top portions before or after embedding.

5. An integrated circuit package system comprising:
   a substrate having a first surface and a second surface;
   a first set of interconnects mounted to the first surface, the first set of interconnects having exposed top portions and at least partial spheroidal shapes;
   a second set of interconnects mounted to the first surface with the second set of interconnects having planarized top portions;
   an integrated circuit die mounted to the first surface; and
   an encapsulant on the substrate in two thicknesses around the integrated circuit die and the interconnects, with the exposed top portions protruding above a top surface of the encapsulant and the planarized top portions coplanar with the top surface of the encapsulant.

6. The system as claimed in claim 5 wherein:
   the encapsulant includes a first thickness around the integrated circuit die and a second thickness around the second set of interconnects.

7. The system as claimed in claim 5 wherein:
   the encapsulant in two thickness includes the encapsulant having a first thickness around the second set of interconnects and a second thickness around the integrated circuit die, the first thickness is thicker than the second thickness.

8. The system as claimed in claim 5 wherein:
   the interconnects having a characteristic of being planarized to have the planarized top portions before or after embedding.

* * * * *